United States Patent [19]

Takechi et al.

[11] Patent Number: 4,800,355
[45] Date of Patent: Jan. 24, 1989

[54] ELECTROMAGNET HAVING MAGNETIC SHIELD

[75] Inventors: Moriaki Takechi; Tsugio Watanabe; Shigenori Kuroda, all of Hyogo, Japan

[73] Assignee: Mitsubishi Denki Kabushiki Kaisha, Tokyo, Japan

[21] Appl. No.: 193,445

[22] Filed: May 12, 1988

[30] Foreign Application Priority Data

May 13, 1987 [JP] Japan .............................. 62-114846

[51] Int. Cl.4 .............................................. H01F 7/00
[52] U.S. Cl. ..................................... 335/301; 335/299
[58] Field of Search ............... 335/301, 299, 214, 216, 335/211; 324/318, 319, 320

[56] References Cited

U.S. PATENT DOCUMENTS

| 4,484,814 | 11/1984 | Kawaguchi et al. | 335/301 |
| 4,646,045 | 2/1987 | Chari et al. | 335/301 |
| 4,646,046 | 2/1987 | Vavrek et al. | 335/301 |
| 4,698,611 | 10/1987 | Veruilyea | 335/301 X |
| 4,743,853 | 5/1988 | Frese | 335/301 X |

Primary Examiner—George Harris
Attorney, Agent, or Firm—Sughrue, Mion, Zinn, Macpeak and Seas

[57] ABSTRACT

An electromagnet has a magnetic shield whose end plate is formed with an asymmetrical side hole 10 in addition to a center opening 6. The thickness of portion 11 of the end plate which covers an area defined by a deviation angle of not more than 180° with a center line passing through a center of the side hole is made larger than the remaining portion of the end plate.

2 Claims, 5 Drawing Sheets

ELECTROMAGNET HAVING MAGNETIC SHIELD

BACKGROUND OF THE INVENTION

The present invention relates to an electromagnet having a magnetic shield for use in a nuclear magnetic resonance diagnostic device which requires a highly uniform magnetic field.

In a conventional electromagnet for use in a nuclear magnetic resonance diagnostic device, it is necessary to generate a uniform and intense magnetic field in an imaging space in an opening of the electromagnet. In generating such magnetic field, there is a considerable problem that flux leakage adversely affects peripheral devices. In order to solve this problem, it has been usual to enclose the electromagnet by a ferromagnetic material to shield it externally.

FIG. 4 shows a conventional electromagnet exemplified by one shown in Japanese Patent Laid-open No. 1437/1983, in which a field winding 1 is wound on a bobbin 2 and shielded by a magnetic shield 3. The magnetic shield 3 is composed of a cylindrical yoke 4 of ferromagnetic material having opposite ends closed by end plates 5 having central openings 6, respectively. A circular disc spacer 7 is disposed between the field coil 1 and each end plate 5.

With such conventional electromagnet, it is possible to reduce a flux leakage effectively. Since the electromagnet for use in the nuclear magnetic resonance diagnostic device requires a highly uniform magnetostatic field, the field coil 1 takes the form of two or more divided coils configulated and arranged by taking the magnetic shield 3 into consideration such that the required uniform magnetic field is obtained. The field coil 1 and the magnetic shield 3 are arranged coaxially and symmetrically in an axial direction. Otherwise, a magnetic gradient would be produced to degrade the uniformity of magnetic field.

In a case of a super conductive electromagnet, for example, it is necessary to form at least one opening in the shield, through which a coolant such as liquid helium is supplied to maintain the field coil 1 at very low temperature and/or for electric conductors to pass to excite the field coil.

FIG. 5a shows another conventional electromagnet having a magnetic shield 3 formed in an end plate with a side hole 10 through which a port portion 9 of a low temperature container 8 is accessed, and FIG. 5b shows another conventional electromagnet having a magnetic shield 3 formed in a yoke portion 4 thereof with such hole 10. Other portions of this example are the same as those used in the device shown in FIG. 4.

In the conventional electromagnet having the magnetic shield as mentioned above, the side hole which is not symmetrical causes a magnetic gradient to be produced, resulting in a degradation of uniformity of the magnetic field produced thereby. In order to compensate this degradation of magnetic field uniformity, the output of a correction coil is increased necessarily. Further, in order to restrict the magnetic field gradient while keeping the symmetrical structure of the magnet, it is necessary to form another side hole 10a in a symmetrical position to the side hole 10 as shown in FIG. 6. However, the additional side hole may cause the shielding effect of the magnetic shield to be lowered necessarily.

SUMMARY OF THE INVENTION

An object of the present invention is to provide an electromagnet having a magnetic shield, in which it is unnecessary to provide any additional side hole for making it magnetically symmetrical and the effect of magnetic shield is high with minimized magnetic field gradient, allowing the correction coil output to be reduced.

The electromagnet having the magnetic shield whose end plate is formed with an assymmetrical side hole in addition to a center opening, according to the present invention, is featured by the thickness of a portion of the end plate which covers an area defined by a deviation angle of not more than 180° with a center line passing through a center of the side hole being made larger than the remaining portion of the end plate.

DETAILED DECRIPTION OF THE PREFERRED EMBODIMENT

Figure 1:
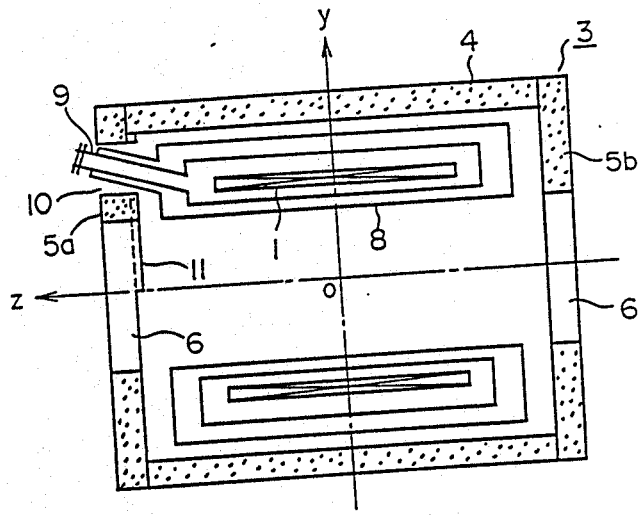
FIG. 1 is a cross section of an embodiment of the present invention.
Figure 2:
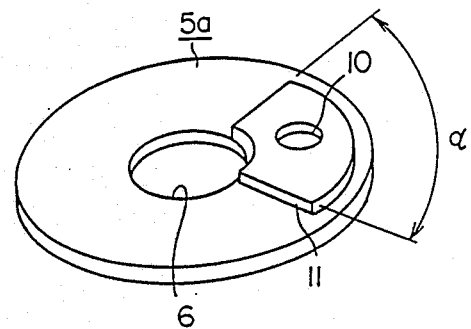
FIG. 2 is a perspective view of end plates of the embodiment shown in FIG. 1.

In FIGS. 1 and 2 which show an embodiment of the present invention, an end plate 5a of a magnetic shield 3 is formed with a center opening 6 and a side hole 10 and the other end plate 5b is formed with a center opening 6.

A thickness of a portion 11 of the end plate 5a in which the side hole 10 is formed is made larger than the remaining portion as shown in FIG. 1. The portion 11 of the end plate 5a is defined, as shown in FIG. 2, by a sector which covers an angle $\alpha$ of not more than 180° with a center line passing through a center of the side hole 10. In other words, the thick portion 11 is formed within a deviation angle of not more than 90° in both directions from a radius passing through the center of the side hole.

Figure 5A:
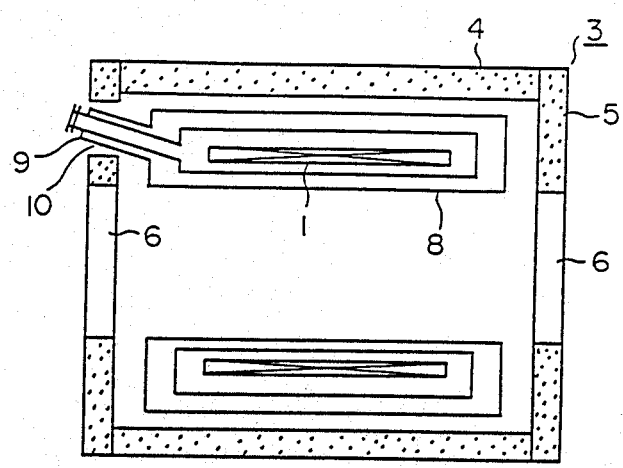
Figure 5B:
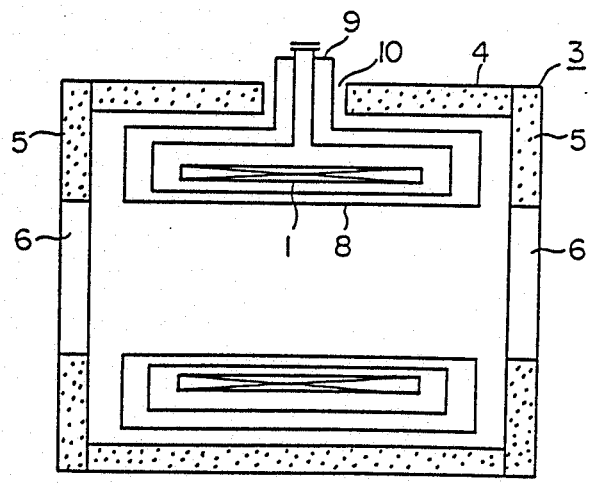
Figure 6:
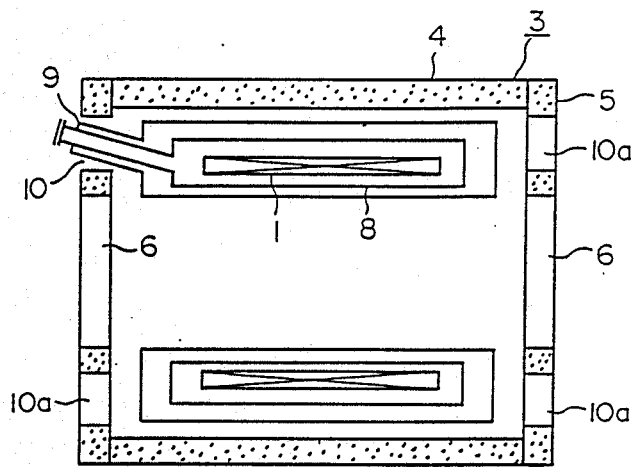

Other portions than the thick portion are the same as those shown in FIG. 5a and depicted by the same reference numerals as those used in the same figure.

With such construction of the magnetic shield as mentioned above, when a position (Z,y) of the side hole 10 in the end plate 5a in a plane passing through an axis of the magnetic shield is defined as $Z>0$ and $y>0$, it becomes assymmetrical magnetically with respect to an original point 0 and a magnetic gradient is produced, resulting in the magnetic field uniformity being degraded. The magnetic gradient in this case is caused by an increase of magnetic resistance in the area of the magnetic shield 3 defined by $Z>0$ and $y>0$ due to the existence of the side hole 10. That is, magnetic gradient components related to the Z axis and the y axis, i.e., components Z, y, Zy and $Z^2y$ etc. of magnetic gradient are increased.

In the present invention, however, the increase of magnetic resistance is restricted by the thicker portion 11 of the end plate 5a and, therefore, the magnetic field gradient is restricted correspondingly, resulting in an improvement of the magnetic field uniformity.

Figure 3:
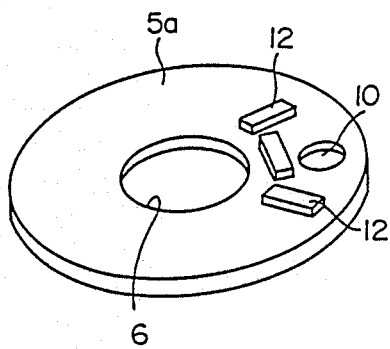
FIG. 3 is a cross section of a main portion of another embodiment of the present invention.
Figure 4:
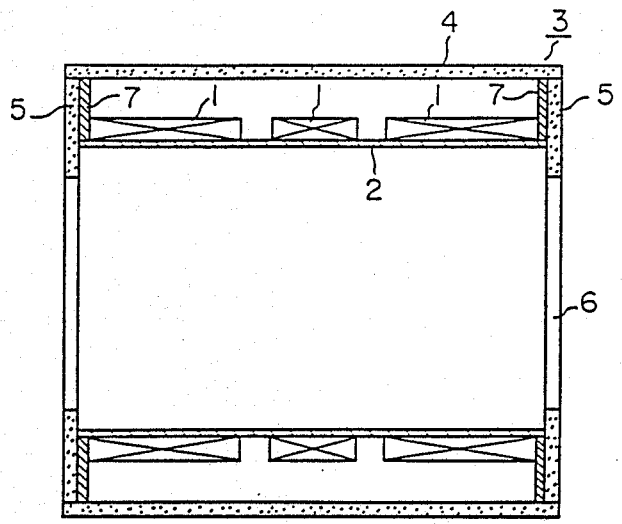
FIGS. 4 to 6 show cross sections of conventional electromagnets having magnetic shields, respectively.

FIG. 3 shows another embodiment of the present invention in which the thickness of the portion 11 of the end plate 5a is apparently increased by attaching regulation pieces 12 of ferromagnetic material onto the end plate 5a having the side hole 10, whose thickness is uniform and the same as that of the other end plate 5b. Since the embodiment shown in FIG. 3 is simply realized by merely attaching the regulation pieces 12 onto the end plate 5a, it is advantageous economically. Further, in this embodiment, it is possible to regulate an amount of correction of asymmetricity of the magnetic shield 3 by changing the number of the regulation pieces 12 to be attached or changing the size of the regulation pieces 12.

Although the embodiments have been described as to the electromagnet employing the superconductive coil, the present invention is also applicable to the usual electromagnet, with the same effect.

As mentioned hereinbefore, according to the present invention in which the thickness of the portion of one of the end plates of the cylindrical magnetic shield, in which the side hole is provided, is increased with respect to other portion of the one end plate as well as the other end plate, it is possible to reduce the non-uniform component of magnetic field produced by the field coil magnetically shielded by the magnetic shield and thus it is possible to at least reduce the magnetic output of the correction coil for correcting the non-uniformity of magnetic field. Further, it is unnecessary to add another side hole for maintaining the magnetic symmetry of the magnetic shield, resulting in an improvement of the magnetic shield effect.

What is claimed is:

1. An electromagnet comprising a magnetic field coil and a magnetic shield composed of a cylindrical yoke of ferromagnetic material and opposite end plates formed with center openings, respectively, and surrounding said magnetic field coil, one of said end plates having an asymmetrical side hole, said one end plate having a portion having a thickness larger than the other portion of said one end plate, said portion being defined within a deviation angle of not more than 90° in both directions from a straight line passing through a center of said center opening and a center of said side hole.

2. The electromagnet as claimed in claim 1, wherein said portion having the larger thickness is provided by attaching at least one regulation piece of ferromagnetic material to said one end plate so that said side hole is substantially surrounded by said regulation piece.

* * * * *